United States Patent
Liu

(10) Patent No.: US 12,191,759 B2
(45) Date of Patent: Jan. 7, 2025

(54) DETECTION CIRCUIT FOR POWER SUPPLY CIRCUIT

(71) Applicant: Power Forest Technology Corporation, Hsinchu County (TW)

(72) Inventor: Chia-Hsien Liu, Hsinchu County (TW)

(73) Assignee: Power Forest Technology Corporation, Hsinchu County (TW)

( * ) Notice: Subject to any disclaimer, the term of this patent is extended or adjusted under 35 U.S.C. 154(b) by 267 days.

(21) Appl. No.: 18/085,587

(22) Filed: Dec. 21, 2022

(65) Prior Publication Data
US 2024/0136916 A1  Apr. 25, 2024

(30) Foreign Application Priority Data
Oct. 18, 2022 (TW) .................................. 111139460

(51) Int. Cl.
*H02M 1/32* (2007.01)
*G01R 1/28* (2006.01)
(Continued)

(52) U.S. Cl.
CPC .............. *H02M 1/327* (2021.05); *G01R 1/28* (2013.01); *G01R 15/04* (2013.01); *G01R 19/04* (2013.01);
(Continued)

(58) Field of Classification Search
CPC .......... H02M 1/32; H02M 1/00; H02M 1/327; H02M 1/0032; G01R 1/28; G01R 15/04;
(Continued)

(56) References Cited

U.S. PATENT DOCUMENTS

| 8,988,905 B2 | 3/2015 | Lin et al. |
| 2015/0009600 A1* | 1/2015 | Aromin .................. G01K 3/005 |
| | | 374/185 |

(Continued)

FOREIGN PATENT DOCUMENTS

| CN | 103036454 | 4/2013 |
| EP | 3901639 | 10/2021 |

(Continued)

OTHER PUBLICATIONS

"Office Action of Taiwan Counterpart Application", issued on Jul. 18, 2023, p. 1-p. 6.

*Primary Examiner* — Danny Nguyen
(74) *Attorney, Agent, or Firm* — JCIPRNET

(57) ABSTRACT

A detection circuit for a power supply circuit is provided. The detection circuit includes a reference circuit, a voltage detection circuit, and a determination circuit. The reference circuit is coupled to a thermal circuit of the power supply circuit through a connection pin. The voltage detection circuit stops the reference circuit from providing a temperature reference signal, and samples a single-phase AC input power through the connection pin. When a peak value information of the single-phase AC input power is sampled, the voltage detection circuit stores the peak value information and enables the reference circuit to provide the temperature reference signal. The determination circuit provides at least one of a waveform detection signal and an over-voltage detection signal in response to the peak value information, and provides an over-temperature detection signal according to at least one of an output signal of the thermal circuit and the peak value information.

14 Claims, 6 Drawing Sheets

(51) Int. Cl.
*G01R 15/04* (2006.01)
*G01R 19/04* (2006.01)
*G01R 31/40* (2020.01)
*H02M 1/00* (2006.01)
*G05D 23/24* (2006.01)

(52) U.S. Cl.
CPC .......... *G01R 31/40* (2013.01); *H02M 1/0032* (2021.05); *H02M 1/32* (2013.01); *G05D 23/24* (2013.01)

(58) Field of Classification Search
CPC .... G01R 19/04; G01R 31/40; G01R 19/1658; G05D 23/24
USPC ........................... 361/86–87, 93.7–93.9, 103
See application file for complete search history.

(56) References Cited

U.S. PATENT DOCUMENTS

| | | | |
|---|---|---|---|
| 2015/0207311 A1* | 7/2015 | Chang | H02H 3/20 361/91.1 |
| 2019/0190387 A1 | 6/2019 | Dalena et al. | |
| 2022/0065933 A1 | 3/2022 | Tseng et al. | |

FOREIGN PATENT DOCUMENTS

| | | |
|---|---|---|
| TW | 201521326 | 6/2015 |
| TW | 201830836 | 8/2018 |

* cited by examiner

DETECTION CIRCUIT FOR POWER SUPPLY CIRCUIT

CROSS-REFERENCE TO RELATED APPLICATION

This application claims the priority benefit of Taiwan application serial no. 111139460, filed on Oct. 18, 2022. The entirety of the above-mentioned patent application is hereby incorporated by reference herein and made a part of this specification.

BACKGROUND

Technical Field

The disclosure relates to a detection circuit, and more particularly, to a detection circuit for a power supply circuit.

Description of Related Art

The detection circuit of the current power supply circuit detects the state of the AC input power located at the power input terminal of the power supply circuit. When an abnormality of the AC input power is detected, the detection circuit may provide a protection mechanism or a warning corresponding to the abnormality of the power supply. In addition, the detection circuit may also detect the temperature of the power supply circuit. When an abnormality of temperature is detected, the detection circuit may provide a protection mechanism or a warning corresponding to the abnormality of the temperature.

However, the method of detecting the temperature is different from the method of detecting the AC input power. The current detection circuit needs to detect the state of the AC input power through one pin, and detect the temperature through another pin. Therefore, the detection circuit needs to have a larger size. It may be seen that the current detection circuit is not conducive to the miniaturization development of the power supply circuit.

SUMMARY

The disclosure provides a detection circuit for a power supply circuit, which may use the same pin to detect the state and the temperature of an AC input power.

A detection circuit of the disclosure is used in a power supply circuit. The power supply circuit includes a thermal circuit. The thermal circuit is coupled to one of the input pins in an AC power input terminal of the power supply circuit. The detection circuit includes the thermal circuit, a reference circuit, a voltage detection circuit, and a determination circuit. The reference circuit is coupled to the thermal circuit through a connection pin. The reference circuit provides a temperature reference signal. The voltage detection circuit is coupled to the connection pin and the reference circuit. The voltage detection circuit enters a sampling mode to stop the reference circuit from providing the temperature reference signal, and samples a single-phase AC input power through the connection pin. When a peak value information of the single-phase AC input power is sampled, the voltage detection circuit enters a hold mode to store the peak value information and enable the reference circuit to provide the temperature reference signal. The determination circuit is coupled to the connection pin. The determination circuit provides at least one of a waveform detection signal and an over-voltage detection signal in response to the peak value information. In the hold mode, the determination circuit provides an over-temperature detection signal according to at least one of an output signal and the peak value information generated by the thermal circuit in response to the temperature reference signal.

Based on the above, the detection circuit samples the single-phase AC input power located at the input pin through the connection pin, and provides at least one of the waveform detection signal and the over-voltage detection signal in response to the peak value information. In addition, the detection circuit obtains the output signal of the thermal circuit through the connection pin to provide the over-temperature detection signal. It may be seen that the detection circuit may detect the state and the temperature of the AC input power only through the connection pin. Accordingly, the size of the detection circuit may be reduced.

In order to make the above-mentioned features and advantages of the disclosure easier to understand, the following specific embodiments are given and described in details with the accompanying drawings as follows.

DESCRIPTION OF THE EMBODIMENTS

Figure 1:
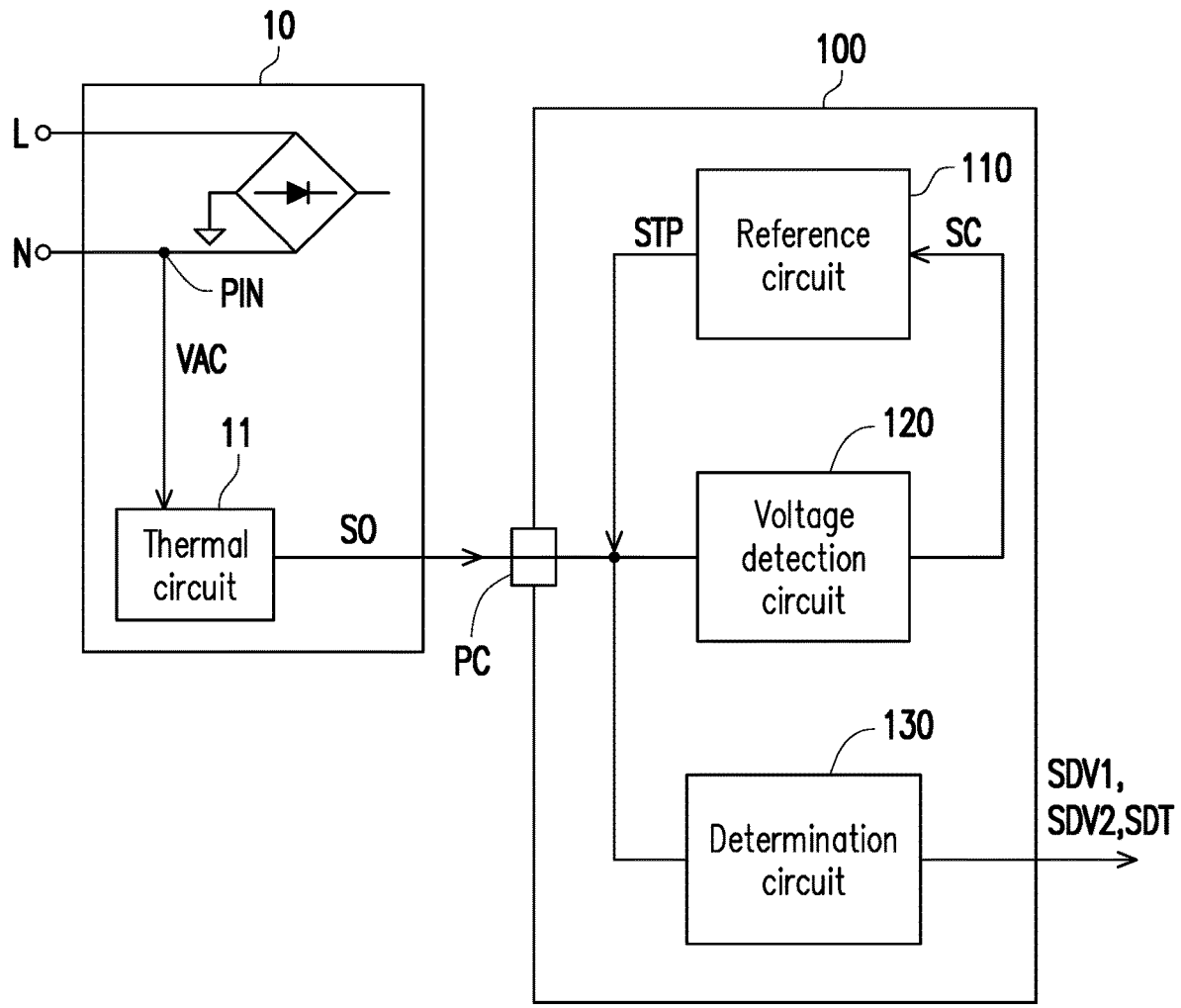
FIG. 1 is a schematic view of a detection circuit according to a first embodiment of the disclosure.

Part of the embodiments of the disclosure will be described in details below with accompanying drawings. For the reference numerals used in the following description, the same reference numerals appearing in different drawings will be regarded as the same or similar elements. These embodiments are only a part of the disclosure and do not disclose all possible implementations of the disclosure. More precisely, these embodiments only serve as examples within the scope of the claims of the disclosure.

Please refer to FIG. 1. FIG. 1 is a schematic view of a detection circuit according to a first embodiment of the disclosure. In the embodiment, a detection circuit 100 may be applied to a power supply circuit 10. The power supply circuit 10 includes a thermal circuit 11. The thermal circuit 11 is coupled to one of input pins PIN in an AC power input terminal of the power supply circuit 10. The input pin PIN may be, for example, one of a fire line pin L or a neutral line pin N. The input pin PIN of the embodiment is exemplified by the neutral line pin. In the embodiment, the detection circuit 100 includes a reference circuit 110, a voltage detection circuit 120, and a determination circuit 130. The reference circuit 110 is coupled to the thermal circuit 11 through a connection pin PC. The reference circuit 110 is operated to provide a temperature reference signal STP. The voltage detection circuit 120 is coupled to the connection pin PC and the reference circuit 110. The voltage detection circuit 120 enters a sampling mode to control the reference circuit 110 to stop providing the temperature reference signal STP. In the sampling mode, the voltage detection circuit 120 samples a single-phase AC input power VAC located at the input pin PIN through the connection pin PC. When a peak value information PKI of the single-phase AC input power VAC is sampled, the voltage detection circuit 120 enters a hold mode to store the peak value information PKI and controls the reference circuit 110 to provide the temperature reference signal STP. In the embodiment, the voltage detection circuit 120 may control the reference circuit 110 using a control signal SC. In the embodiment, the temperature reference signal STP may be a current signal or a voltage signal.

For example, the voltage detection circuit 120 is, for example, a central processing unit (CPU), or other programmable general-purpose or special-purpose microprocessors, a programmable controller, an application specific integrated circuit (ASIC), a programmable logic device (PLD), other similar devices, or a combination of these devices which may load and execute a computer program.

In the embodiment, the determination circuit 130 is coupled to the connection pin PC. The determination circuit 130 provides at least one of a waveform detection signal SDV1 and an over-voltage detection signal SDV2 in response to the peak value information PKI. In the hold mode, the determination circuit 130 provides an over-temperature detection signal SDT according to at least one of an output signal SO and the peak value information PKI of the thermal circuit 11 in response to the temperature reference signal STP.

For example, the determination circuit 130 provides at least one of the waveform detection signal SDV1 and the over-voltage detection signal SDV2 in one of the sampling mode and the hold mode. The waveform detection signal SDV1 may be an indication signal associated with a waveform detection result of "brown in" and "brown out" of the single-phase AC input power VAC. The over-voltage detection signal SDV2 may be an indication signal associated with a peak detection result of the single-phase AC input power VAC. For example, in the hold mode, the thermal circuit 11 provides the output signal SO in response to the temperature reference signal STP. The determination circuit 130 obtains a voltage level of the output signal SO through the connection pin PC, thereby providing the over-temperature detection signal SDT associated with the voltage level of the output signal SO. The over-temperature detection signal SDT may be an indication signal associated with a detection result of the temperature. The above temperature may be the temperature of the heat source in the power supply circuit 10 or the ambient temperature.

It is worth mentioning here that the detection circuit 100 samples the single-phase AC input power VAC through the connection pin PC, and provides at least one of the waveform detection signal SDV1 and the over-voltage detection signal SDV2 in response to the peak value information PKI. In addition, the detection circuit 100 also obtains the output signal SO of the thermal circuit 11 through the connection pin PC to provide the over-temperature detection signal SDT. It may be seen that the detection circuit 100 may detect the state and the temperature of the AC input power VAC only through the connection pin PC. Accordingly, the size of the detection circuit 100 may be reduced.

In the embodiment, the power supply circuit 10 and the detection circuit 100 may be a power supply system.

In some embodiments, the power supply circuit 10 may be driven by a control circuit (not shown). The detection circuit 100 may be disposed in the control circuit or electrically connected to the control circuit. Therefore, the control circuit may control the power supply circuit 10 based on at least one of the waveform detection signal SDV1, the over-voltage detection signal SDV2, and the over-temperature detection signal SDT.

Figure 2:
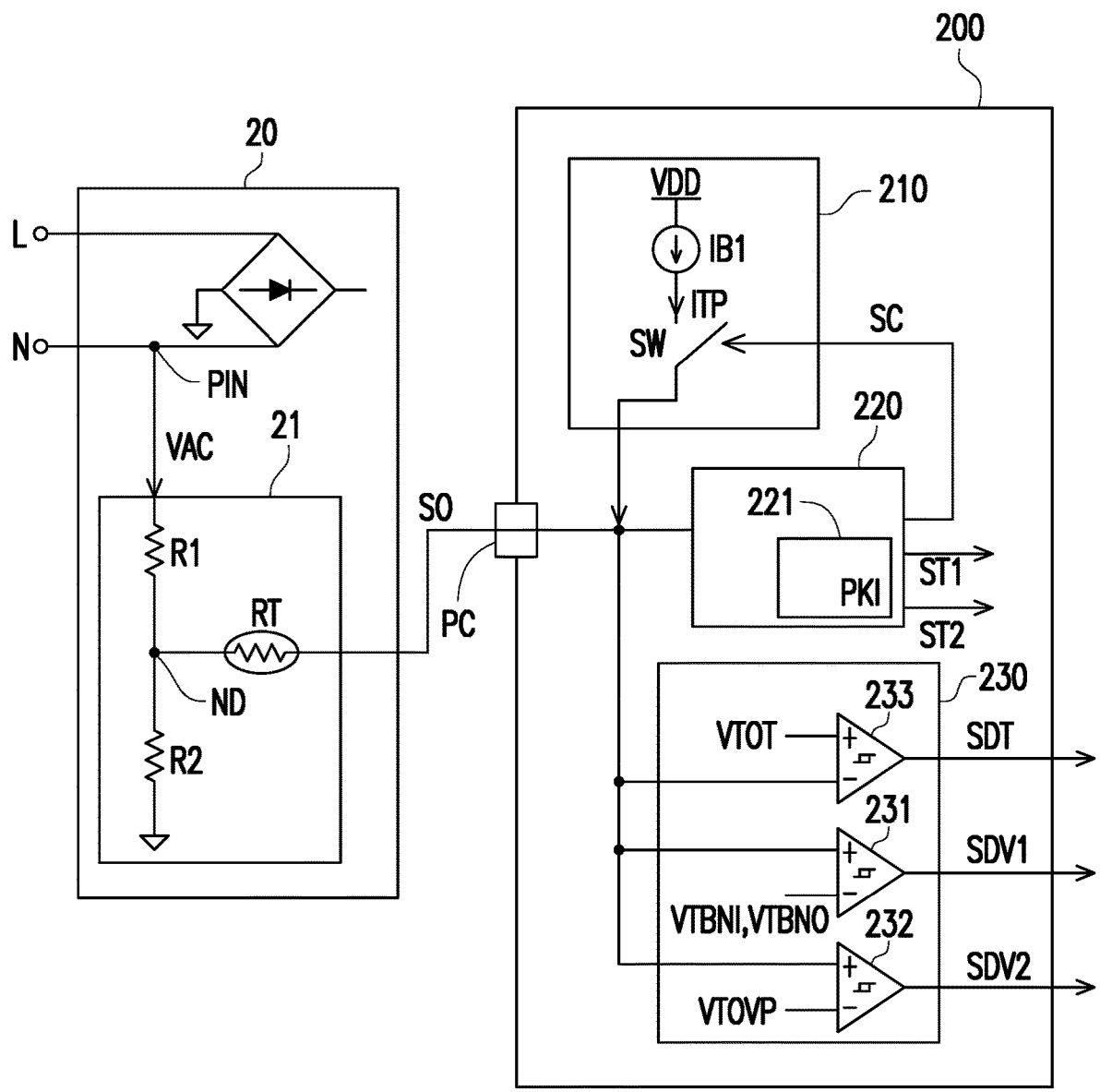
FIG. 2 is a schematic view of a detection circuit according to a second embodiment of the disclosure.

Please refer to FIG. 2. FIG. 2 is a schematic view of a detection circuit according to a second embodiment of the disclosure. In the embodiment, a power supply circuit 20 includes a thermal circuit 21. The thermal circuit 21 includes a resistor R1, a resistor R2, and a thermistor RT. The resistor R1 is coupled between the input pin PIN and a voltage dividing node ND. The resistor R2 is coupled between the voltage dividing node ND and a reference low voltage (e.g., a ground). A first terminal of the thermistor RT is coupled to the voltage dividing node ND. A second terminal of the thermistor RT is coupled to the connection pin PC. The thermistor RT has, for example, a negative temperature coefficient (NTC).

In the embodiment, in the embodiment, a detection circuit 200 includes a reference circuit 210, a voltage detection circuit 220, and a determination circuit 230. The reference circuit 210 includes a reference power IB and a switch SW. The reference power IB provides a temperature reference signal ITP. Taking the embodiment as an example, the reference power IB may be a current source. Therefore, the temperature reference signal ITP is a current signal. A first terminal of the switch SW is coupled to the reference power IB. A second terminal of the switch SW is coupled to the second terminal of the thermistor RT. A control terminal of the switch SW is coupled to the voltage detection circuit 220. The voltage detection circuit 220 turns off the switch SW in the sampling mode, and turns on the switch SW in the hold mode. Therefore, in the sampling mode, the temperature reference signal ITP is not provided to the connection pin PC and the thermal circuit 21. In the hold mode, the temperature reference signal ITP is provided to the connection pin PC and the thermal circuit 21. In some embodiments, the reference power IB may be a voltage source. Therefore, the temperature reference signal ITP is a voltage signal.

The switch SW may be implemented by at least a transistor or a transmission gate.

In the embodiment, the determination circuit 230 includes a first comparator circuit 231, a second comparator circuit 232, and a third comparator circuit 233. The first comparator circuit 231 is coupled to the connection pin PC. In the sampling mode, the first comparator circuit 231 provides the waveform detection signal SDV1 according to an over-voltage threshold value VTBNI, an under-voltage threshold value VTBNO, and a voltage value located at the connection pin PC. A non-inverting input terminal of the first comparator circuit 231 is coupled to the connection pin PC. An inverting input terminal of the first comparator circuit 231 receives the over-voltage threshold value VTBNI and the under-voltage threshold value VTBNO in a time-division manner. Therefore, the first comparator circuit 231 compares the voltage value located at the connection pin PC (i.e., a voltage value of the output signal SO) with the over-voltage threshold value VTBNI and the under-voltage threshold value VTBNO to output the waveform detection signal SDV1 at an output terminal of the first comparator circuit 231. In the sampling mode, when the voltage value of the output signal SO exceeds the range defined by the over-voltage threshold value VTBNI and the under-voltage threshold value VTBNO, the first comparator circuit 231 provides the waveform detection signal SDV1 associated with an abnormality of the waveform of the single-phase AC input power VAC. When the voltage value of the output signal SO conforms to the range defined by the over-voltage threshold value VTBNI and the under-voltage threshold value VTBNO, the first comparator circuit 231 provides the waveform detection signal SDV1 associated with the single-phase AC input power VAC having a normal waveform.

The second comparator circuit 232 is coupled to the connection pin PC. In the sampling mode, the second comparator circuit 232 provides the over-voltage detection signal SDV2 according to an over-voltage protection threshold value VTOVP and the voltage value located at the connection pin PC. A non-inverting input terminal of the second comparator circuit 232 is coupled to the connection pin PC. An inverting input terminal of the second comparator circuit 232 receives the over-voltage protection threshold value VTOVP. Therefore, the second comparator circuit 232 compares the voltage value located at the connection pin PC (i.e., the voltage value of the output signal SO) with the over-voltage protection threshold value VTOVP to output the over-voltage detection signal SDV2 at the output terminal of the first comparator circuit 231. In the sampling mode, when the voltage value of the output signal SO is greater than the over-voltage protection threshold value VTOVP, the second comparator circuit 232 provides the over-voltage detection signal SDV2 associated with an over-voltage of the single-phase AC input power VAC. When the voltage value of the output signal SO is less than or equal to the over-voltage protection threshold value VTOVP, the second comparator circuit 232 provides the over-voltage detection signal SDV2 associated with the single-phase AC input power VAC without over-voltage.

The third comparator circuit 233 is coupled to the connection pin PC. In the hold mode, the third comparator circuit 233 provides the over-temperature detection signal SDT according to an over-temperature voltage threshold value VTOT and the voltage value located at the connection pin PC. An inverting input terminal of the third comparator circuit 233 is coupled to the connection pin PC. A non-inverting input terminal of the third comparator circuit 233 receives the over-temperature voltage threshold value VTOT. Therefore, the third comparator circuit 233 compares the voltage value located at the connection pin PC (i.e., the voltage value of the output signal SO) with the over-temperature voltage threshold value VTOT to output the over-temperature detection signal SDT at the output terminal of the first comparator circuit 231. In the hold mode, the voltage value of the output signal SO is associated with the product of a resistance value of the thermistor RT and a current value of the temperature reference signal ITP. The thermistor RT has an NTC. Therefore, the higher the temperature, the lower the product. The voltage value of the output signal SO is also lower. When the voltage value of the output signal SO is greater than the over-temperature voltage threshold value VTOT, the third comparator circuit 233 provides the over-temperature detection signal SDT associated with a normal temperature. When the voltage value of the output signal SO is less than or equal to the over-temperature voltage threshold value VTOT, the third comparator circuit 233 provides the over-temperature detection signal SDT associated with an over-temperature.

Figure 3:
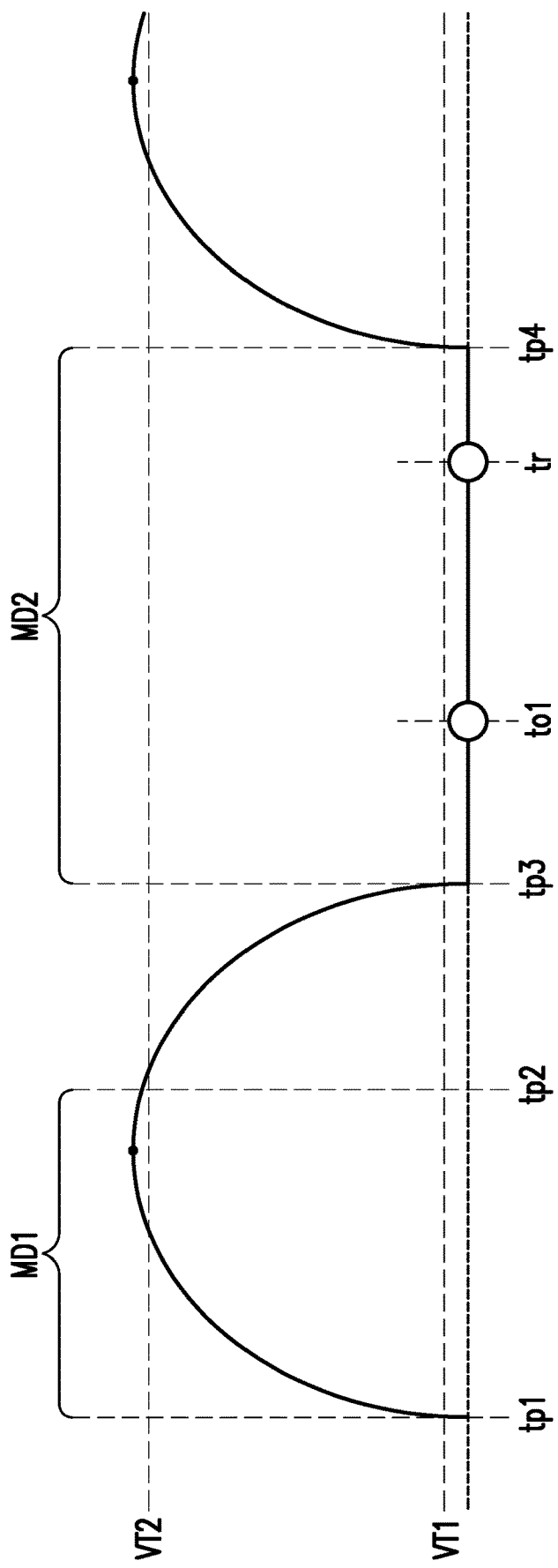
FIG. 3 is a schematic view of a waveform and a detection item of a single-phase AC input power according to a second embodiment of the disclosure.

For further description, please refer to FIG. 2 and FIG. 3 at the same time. FIG. 3 is a schematic view of a waveform and a detection item of a single-phase AC input power according to a second embodiment of the disclosure. At a time point tp1, when the voltage value of the voltage value of the single-phase AC input power VAC is higher than a voltage threshold value VT1, the voltage detection circuit 220 enters a sampling mode MD1. In the sampling mode MD1, the voltage detection circuit 220 turns off the switch SW using the control signal SC. Therefore, the reference circuit 210 stops providing the temperature reference signal ITP. In addition, in the sampling mode MD1, the voltage detection circuit 220 samples the single-phase AC input power VAC located at the input pin PIN through the connection pin PC. During the period from time points tp1 to tp2, the voltage detection circuit 220 samples the peak value information PKI of the single-phase AC input power VAC. The peak value information PKI includes a voltage peak value of the single-phase AC input power VAC. In the embodiment, the voltage detection circuit 220 includes a storage circuit 221. The storage circuit 221 stores the peak value information PKI. The storage circuit 221 may be any form of a programmable memory element.

Based on a configuration of the thermal circuit 21, a voltage value VSO of the output signal SO is as shown in Formula (1).

$$VSO = \frac{rR2}{rR1 + rR2} \cdot VACP \qquad \text{Formula (1)}$$

rR1 is a resistance value of the resistor R1. rR2 is a resistance value of the resistor R2. VACP is the voltage peak value of the single-phase AC input power VAC. Therefore, in the sampling mode MD1, the voltage value VSO of the output signal SO located at the connection pin PC is associated with the resistance values of the resistor R1 and the resistor R2. The determination circuit 230 may derive the root mean square value VAC(RMS) of the single-phase AC input power VAC from Formula (2).

$$VAC(RMS) = \frac{1}{\sqrt{2}} \cdot \frac{rR1 + rR2}{rR2} \cdot VSO \qquad \text{Formula (2)}$$

In addition, in the sampling mode MD1, the voltage detection circuit 220 provides, for xample, a state signal ST1 and a state signal ST2 (the disclosure is not limited hereto). For example, the state signal ST1 may be a charge storage state signal of a safety capacitor (not shown) disposed at the AC power input terminal. The state signal ST2 may be a state signal indicating whether the AC power input terminal receives an AC power.

At time point tp3, the voltage detection circuit 220 enters a hold mode MD2 to store the peak value information PKI and controls the reference circuit 210 to provide the temperature reference signal ITP. It should be noted that the peak value information PKI includes waveform information having the voltage peak value of the single-phase AC input power VAC. Taking the embodiment as an example, when a voltage value of the single-phase AC input power VAC drops to a voltage threshold value VT2, the voltage detection circuit 220 samples the peak value information PKI of the single-phase AC input power VAC. Therefore, the peak value information PKI records the waveforms of the single-phase AC input power VAC at the time points tp1 to tp2.

In the hold mode MD2, when the voltage value of the single-phase AC input power VAC is lower than the voltage threshold value VT1, the voltage detection circuit 220 turns on the switch SW. In the embodiment, the voltage threshold value VT1 may be a voltage value close to 0 volts (e.g., 0.2 volts). Therefore, at an operation time point to1 between time points tp3 and tp4, the voltage detection circuit 220 turns on the switch SW, so that the reference power IB provides the temperature reference signal ITP to the connection pin PC.

Based on the configuration of the thermal circuit 21 and the reference circuit 210, a voltage value Vx(t) at the voltage dividing node ND may be derived from Formula (3).

$$Vx(t) = \frac{rR2}{rR1+rR2} \cdot (iITP \cdot rR1 + VAC(t)) \quad \text{Formula (3)}$$

iITP is the current value of the temperature reference signal ITP. VAC(t) is the voltage value of the single-phase AC input power VAC. Formula (3) may be expanded to Formula (3').

$$Vx(t) = \frac{rR1 \cdot rR2 \cdot iITP}{rR1+rR2} + \frac{rR2 \cdot VAC(t)}{rR1+rR2} \quad \text{Formula (3')}$$

In the hold mode MD2, the voltage value of the single-phase AC input power VAC approaches zero. Therefore, the voltage value Vx(t) at the voltage dividing node ND is as shown in Formula (4).

$$Vx(t) = \frac{rR1 \cdot rR2}{rR1+rR2} \cdot iITP \quad \text{Formula (4)}$$

Further, the resistance value of the resistor R1 is designed to be much greater than the resistance value of the resistor R2. For example, the resistance value of the resistor R1 is 100 times greater than the resistance value of the resistor R2. Therefore, Formula (5) may be simplified to Formula (5).

$$Vx(t) = rR2 \cdot iITP \quad \text{Formula (5)}$$

In addition, based on the configuration of the thermal circuit 21 and the reference circuit 210, the voltage value VSO of the output signal SO located at the connection pin PC satisfies Formula (6).

$$VSO = Vx(t) + iITP \cdot IRT \quad \text{Formula (6)}$$

rRT is the resistance value of the thermistor RT. Therefore, the determination circuit 230 may know that rRT is a variation of the resistance value of the thermistor RT based on the voltage value of the output signal SO.

Furthermore, Formula (4) and Formula (6) may be combined to form Formula (7).

$$VSO = \frac{rR1 \cdot rR2}{rR1+rR2} \cdot iITP + iITP \cdot rRT \quad \text{Formula (7)}$$

Formula (7) is converted to Formula (8).

$$rRT = \frac{VSO}{iITP} - \frac{rR1 \cdot rR2}{rR1+rR2} \quad \text{Formula (8)}$$

Furthermore, when the resistance value of the resistor R1 is designed to be much greater than the resistance value of the resistor R2, Formula (8) is simplified to Formula (8').

$$rRT \approx \frac{VSO}{iITP} - rR2 \quad \text{Formula (8')}$$

It may be seen that, in design, based on Formula (8'), the resistance value of the thermistor RT is determined by the voltage value VSO of the output signal SO, the current value of the temperature reference signal ITP, and the resistance value of the resistor R2.

The determination circuit 230 provides the over-temperature detection signal SDT according to the output signal SO generated by the thermal circuit 21 in response to the temperature reference signal ITP. At a reset time point tr between the time points tp3 and tp4, the voltage detection circuit 220 resets the peak value information PKI and turns off the switch SW.

At the time point tp4, when the voltage value of the voltage value of the single-phase AC input power VAC is higher than the voltage threshold value VT1, the voltage detection circuit 220 enters the sampling mode MD1.

Figure 4:
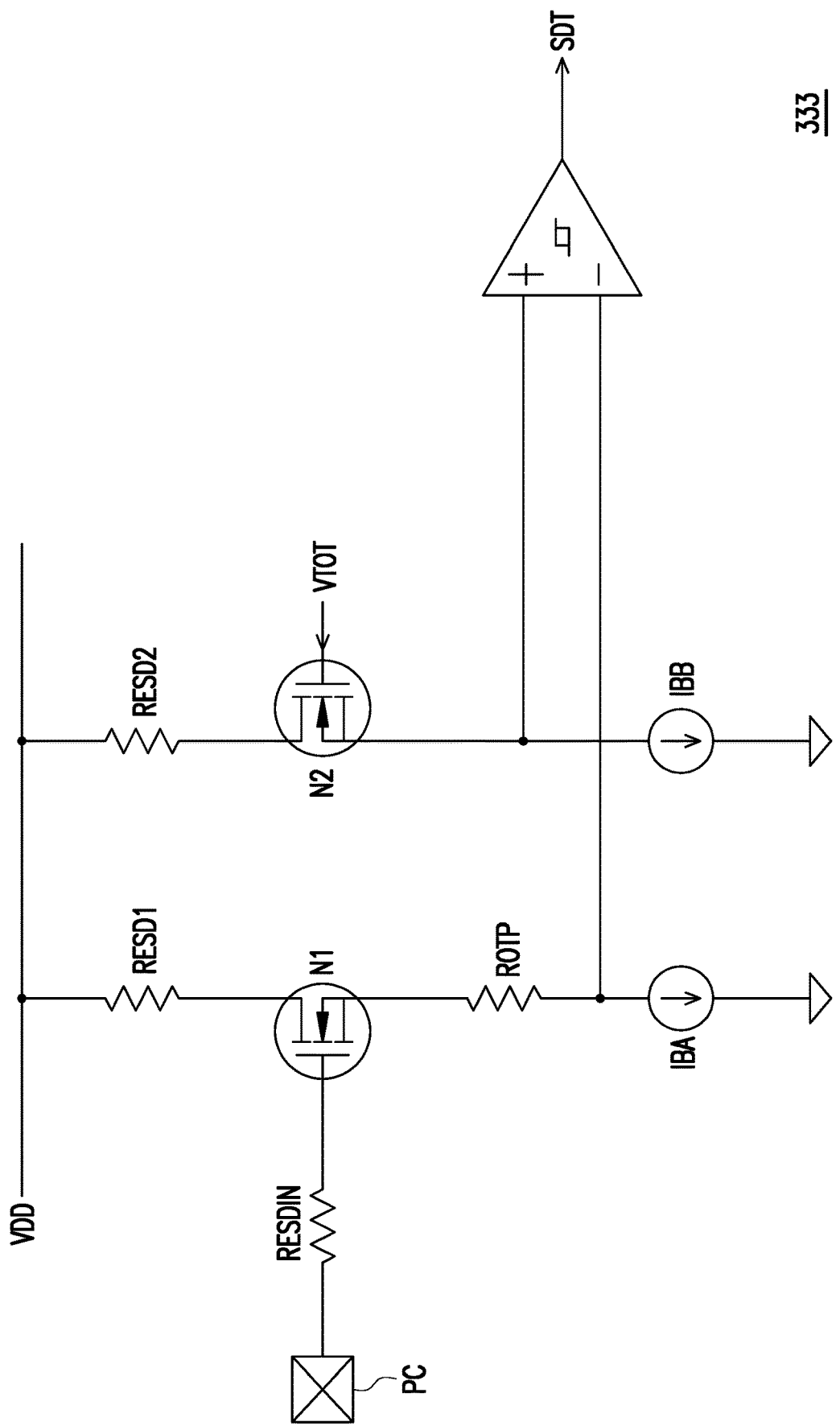
FIG. 4 is a schematic view of a third comparator circuit according to an embodiment of the disclosure.

Please refer to FIG. 4. FIG. 4 is a schematic view of a third comparator circuit according to an embodiment of the disclosure. In the embodiment, a third comparator circuit 333 includes a transistor N1, a transistor N2, a reference power IBA, a reference power IBB, a resistor RESDIN, a resistor RESD1, a resistor RESD2, a resistor ROTP, and a comparator CP. The resistor RESDIN is coupled between the connection pin PC and a control terminal of the transistor N1. The resistor RESD1 is coupled between a reference high voltage VDD and a first terminal of the transistor N1. The resistor RESD2 is coupled between the reference high voltage VDD and a first terminal of the transistor N2. The resistor ROTP is coupled between a second terminal of the transistor N1 and an inverting input terminal of the comparator CP. A second terminal of the transistor N2 is coupled to a non-inverting input terminal of the comparator CP. A control terminal of the transistor N2 receives the over-temperature voltage threshold value VTOT. The reference power IBA is coupled between the inverting input terminal and the reference low voltage. The reference power IBB is coupled between the non-inverting input terminal and the reference low voltage. An output terminal of the comparator CP is used for outputting the over-temperature detection signal SDT. The transistor N1 and the transistor N2 in the embodiment are exemplified by N-type transistors, respectively, such as NMOSs (the disclosure is not limited hereto). The reference power IBA and the reference power IBB are, for example, current sources.

In the embodiment, the over-temperature voltage threshold value VTOT is a voltage division value of the voltage peak value of the peak value information PKI stored by the voltage detection circuit. In other words, the over-temperature voltage threshold value VTOT may be determined by the peak value information PKI.

In the embodiment, Formula (9) may be determined based on a configuration of the third comparator circuit 333.

$$VSO - VN1 - VP = VTOT - VN2 \quad \text{Formula (9)}$$

VN1 is a critical value of the transistor N1. VN2 is a critical value of the transistor N2. VP is a cross-voltage between two sides of the resistor ROTP.

Formula (9) is expanded to Formula (10).

$$iITP \cdot rRT + \frac{rR1 \cdot rR2 \cdot iITP}{rR1+rR2} + \frac{rR2 \cdot VAC(t)}{rR1+rR2} - VN1 - VP = \frac{rR2 \cdot VACP}{rR1+rR2} - VN2 \quad \text{Formula (10)}$$

Assume that the transistor N1 and the transistor N2 have the same design. Therefore, VN1 is equal to VN2. The reference power IBA and the reference power IBB have the same design, and a voltage value VAC(t) of the single-phase AC input power VAC is equal to the voltage peak value VACP of the single-phase AC input power VAC. Formula (10) may be simplified as Formula (10').

$$rRT = \frac{VP}{iITP} - \frac{rR1 \cdot rR2}{rR1 + rR2} \qquad \text{Formula (10')}$$

In addition, the resistance value of the resistor R1 is designed to be much greater than the resistance value of the resistor R2. Formula (10') may be simplified to Formula (10").

$$rRT = \frac{VP}{iITP} - rR2 \qquad \text{Formula (10")}$$

Furthermore, the cross-voltage between the two sides of the resistor ROTP may be designed to be equal to the over-temperature voltage threshold value VTOT. When the voltage value of the output signal SO is greater than the over-temperature voltage threshold value VTOT, the SDT for triggering an over-temperature protection is provided. Therefore, in design, based on Formula (10"), the resistance value of the thermistor RT is determined by the over-temperature voltage threshold value VTOT, the current value of the temperature reference signal ITP, and the resistance value of the resistor R2.

Figure 5:
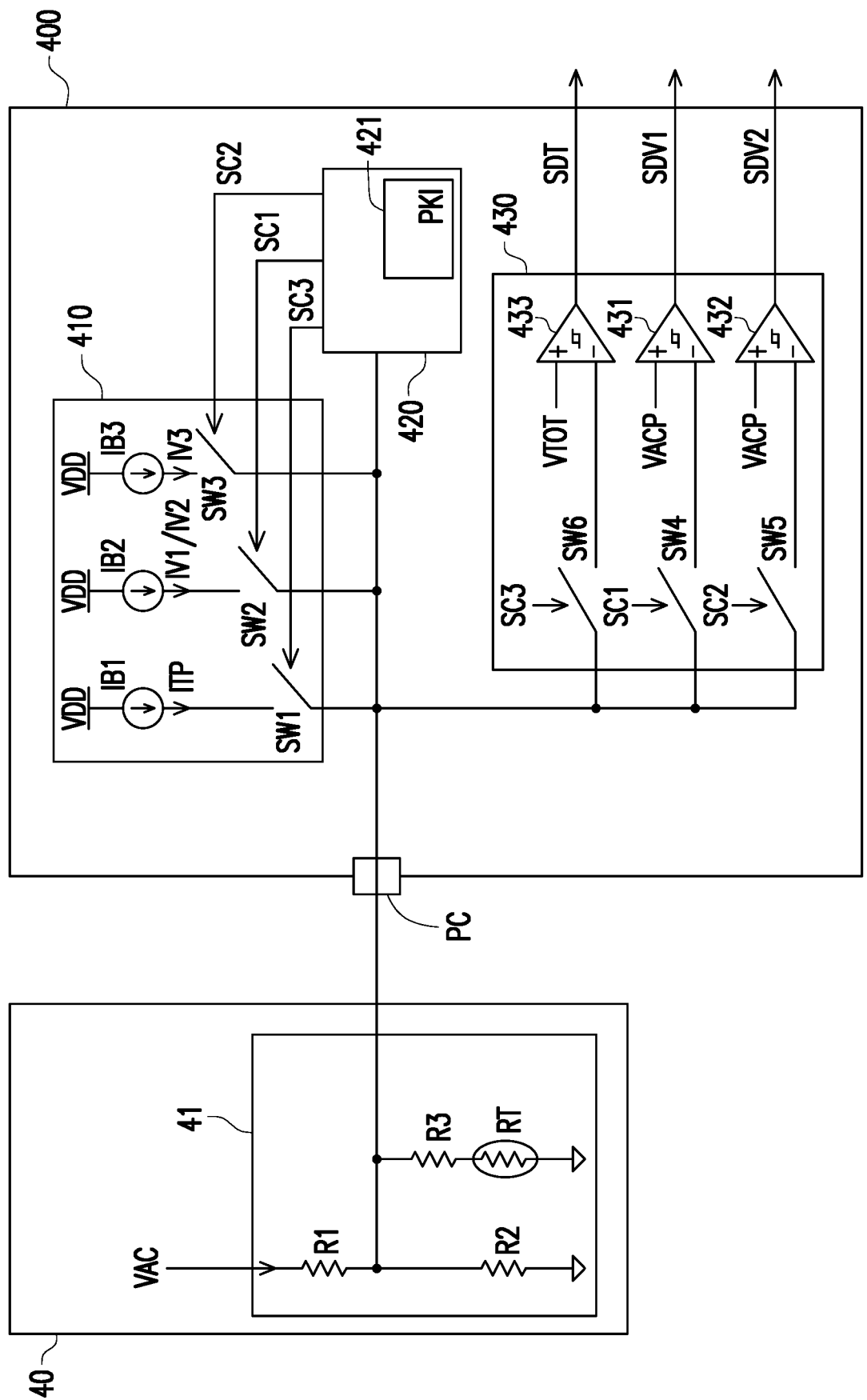
FIG. 5 is a schematic view of a detection circuit according to a third embodiment of the disclosure.

Please refer to FIG. 5. FIG. 5 is a schematic view of a detection circuit according to a third embodiment of the disclosure. In the embodiment, a power supply circuit 40 includes a thermal circuit 41. The thermal circuit 41 includes the resistor R1, the resistor R2, a resistor R3, and the thermistor RT. The resistor R1 is coupled between the input pin and the connection pin PC. The resistor R2 is coupled between the connection pin PC and the reference low voltage. A first terminal of the resistor R3 is coupled to the connection pin PC. The thermistor is coupled between a second terminal of the resistor R3 and the reference low voltage. The thermistor RT has, for example, an NTC.

In the embodiment, a detection circuit 400 includes a reference circuit 410, a voltage detection circuit 420, and a determination circuit 430. The reference circuit 410 includes a reference power IB1, a reference power IB2, and a reference power IB3 and a switch SW1, a switch SW2, and a switch SW3. The reference power IB1 provides the temperature reference signal ITP. A first terminal of the switch SW1 is coupled to the reference power IB1. A second terminal of the switch SW1 is coupled to the connection pin PC. A control terminal of the switch SW1 is coupled to the voltage detection circuit 420 to receive a control signal SC3. The reference power IB2 sequentially provides a voltage reference signal IV1 and a voltage reference signal IV2. In the embodiment, the voltage reference signal IV1 and the voltage reference signal IV2 are current signals, respectively. A first terminal of the switch SW2 is coupled to the reference power IB2. A second terminal of the switch SW2 is coupled to the connection pin PC. A control terminal of the switch SW2 is coupled to the voltage detection circuit 420 to receive a control signal SC1. The reference power IB3 provides a voltage reference signal IV3. A first terminal of the switch SW3 is coupled to the reference power IB3. A second terminal of the switch SW3 is coupled to the connection pin PC. A control terminal of the switch SW3 is coupled to the voltage detection circuit 420 to receive a control signal SC2. Taking the embodiment as an example, the reference power IB1, the reference power IB2, and the reference power IB3 may be current sources, respectively. Therefore, the temperature reference signal ITP and the voltage reference signals IV1 to IV3 are current signals, respectively. In some embodiments, the reference power IB1, the reference power IB2, and the reference power IB3 may be voltage sources, respectively. Therefore, the temperature reference signal ITP and the voltage reference signals IV1 to IV3 are voltage signals, respectively.

In the embodiment, the voltage detection circuit 420 turns off the switch SW1, the switch SW2, and the switch SW3 in the sampling mode, and turns on the switch SW1, the switch SW2, and the switch SW3 in the hold mode. Further, the voltage detection circuit 420 turns on the switch SW1, the switch SW2, and the switch SW3 at different operation time points in the hold mode.

In the embodiment, the determination circuit 430 includes a first comparator circuit 431, a second comparator circuit 432, and a third comparator circuit 433. The first comparator circuit 431 is coupled to the connection pin PC. In the hold mode, the first comparator circuit 431 provides the waveform detection signal SDV1 according to the peak value information PKI and the voltage value located at the connection pin PC. The second comparator circuit 432 is coupled to the connection pin PC. In the hold mode, the second comparator circuit 432 provides the over-voltage detection signal SDV2 according to the peak value information PKI and the voltage value located at the connection pin PC. The third comparator circuit 433 is coupled to the connection pin PC. In the hold mode, the third comparator circuit 433 provides the over-temperature detection signal SDT according to the over-temperature voltage threshold value VTOT and the voltage value located at the connection pin PC.

In the embodiment, the determination circuit 430 further includes a switch SW4, a switch SW5, and a switch SW6. A first terminal of the switch SW4 is coupled to the connection pin PC. A second terminal of the switch SW4 is coupled to an inverting input terminal of the first comparator circuit 431. A control terminal of the switch SW4 receives the control signal SC1. A non-inverting input terminal of the first comparator circuit 431 receives the voltage peak value VACP of the peak value information PKI. An output terminal of the first comparator circuit 431 is used for outputting the waveform detection signal SDV1. Therefore, when the switch SW2 and the switch SW4 are turned on, the first comparator circuit 431 compares the voltage peak value VACP with the voltage value located at the connection pin PC to provide the waveform detection signal SDV1. A first terminal of the switch SW5 is coupled to the connection pin PC. A second terminal of the switch SW5 is coupled to an inverting input terminal of the second comparator circuit 432. A control terminal of the switch SW5 receives the control signal SC2. A non-inverting input terminal of the second comparator circuit 432 receives the voltage peak value VACP of the peak value information PKI. An output terminal of the second comparator circuit 432 is used for outputting a waveform detection signal SDV2. Therefore, when the switch SW3 and the switch SW5 are turned on, the second comparator circuit 432 compares the voltage peak value VACP with the voltage value located at the connection pin PC to provide the over-voltage detection signal SDV2. A first terminal of the switch SW6 is coupled to the connection pin PC. A second terminal of the switch SW6 is coupled to an inverting input terminal of the third comparator circuit 433. A control terminal of the switch SW6 receives the control signal SC3. A non-inverting input terminal of the third comparator circuit 433 receives the over-temperature voltage threshold value VTOT. An output terminal of the third comparator circuit 433 is used for outputting the waveform detection signal SDV2. Therefore, when the switch SW1 and the switch SW6 are turned on, the third comparator circuit 433 compares the over-temperature voltage threshold value VTOT with the voltage value located at the connection pin PC to provide the over-temperature detection signal SDT.

The switches SW1 to SW6 may be implemented by at least a transistor or a transmission gate, respectively.

Figure 6:
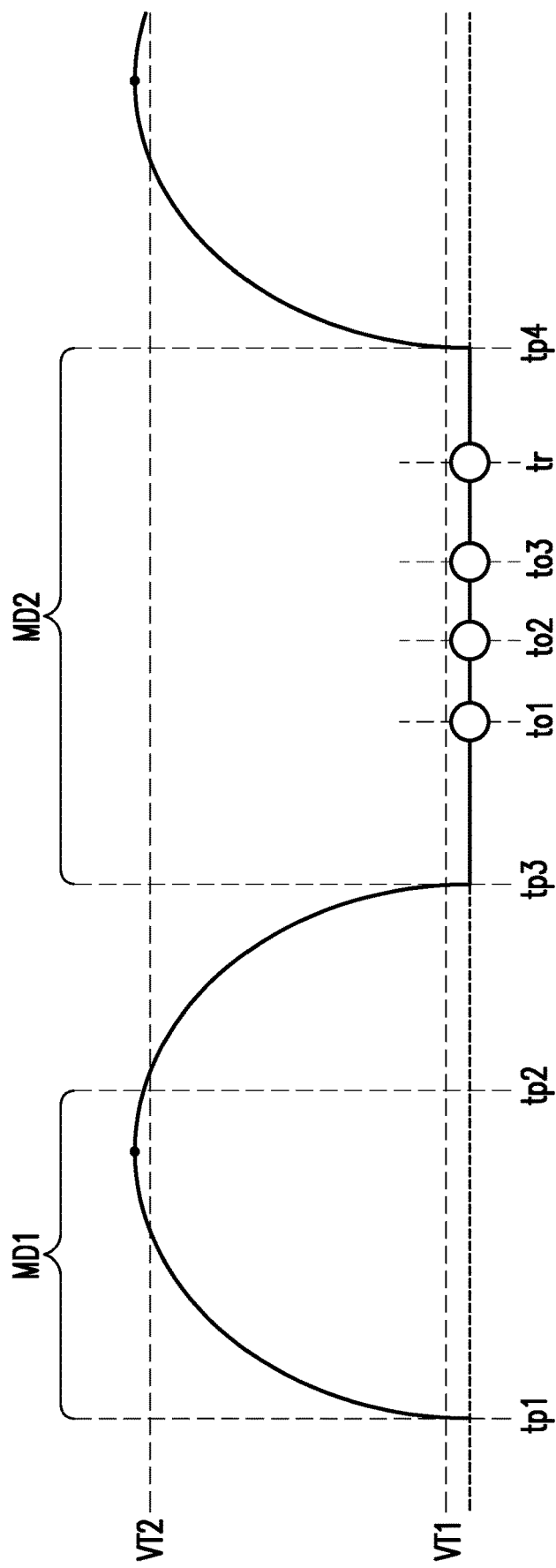
FIG. 6 is a schematic view of a waveform and a detection item of a single-phase AC input power according to a third embodiment of the disclosure.

Please refer to FIG. 5 and FIG. 6 at the same time. FIG. 6 is a schematic view of a waveform and a detection item of a single-phase AC input power according to a third embodiment of the disclosure. At the time point tp1, when the voltage value of the voltage value of the single-phase AC input power VAC is higher than the voltage threshold value VT1, the voltage detection circuit 420 enters the sampling mode MD1. In the sampling mode MD1, the voltage detection circuit 420 turns off the switches SW1 to SW6 using the control signal SC1, the control signal SC2, and the control signal SC3. Therefore, the reference circuit 410 stops providing the temperature reference signal ITP and the voltage reference signals IV1 to IV4. In the sampling mode MD1, the voltage detection circuit 420 samples the single-phase AC input power VAC located at the input pin PIN through the connection pin PC. During the period from the time points tp1 to tp2, the voltage detection circuit 420 samples the peak value information PKI of the single-phase AC input power VAC. The peak value information PKI includes the voltage peak value of the single-phase AC input power VAC.

At the time point tp3, the voltage detection circuit 420 enters the hold mode MD2 to store the peak value information PKI. In the hold mode MD2, the voltage value of the single-phase AC input power VAC is lower than the voltage threshold value VT1. In the embodiment, the voltage threshold value VT1 may be a voltage value close to 0 volts (e.g., 0.2 volts). In the embodiment, the voltage detection circuit 420 includes a storage circuit 421. The storage circuit 421 stores the peak value information PKI.

Based on a configuration of the thermal circuit 41, the voltage value VSO of the output signal SO located at the connection pin PC is as shown in Formula (11).

$$VSO = \frac{(rR2 // (rR3 + rRT))}{rR1 + (rR2 // (rR3 + rRT))} \cdot VACP \quad \text{Formula (11)}$$

rR3 is a resistance value of the resistor R3. Formula (11) may be expanded to Formula (11').

$$VSO = \frac{\frac{1}{rR1}}{\frac{1}{rR1} + \frac{1}{rR2} + \frac{1}{rR3 + rRT}} \cdot VACP \quad \text{Formula (11')}$$

In addition, in the hold mode MD2, the voltage value of the single-phase AC input power VAC approaches zero. Therefore, the voltage value VSO of the output signal SO is also as shown in Formula (12).

$$VSO = \frac{ID}{\frac{1}{rR1} + \frac{1}{rR2} + \frac{1}{rR3 + rRT}} \quad \text{Formula (12)}$$

ID is a current value of one of the voltage reference signal IV1, the voltage reference signal IV2, and the voltage reference signal IV3. Formula (13) may be generated according to Formula (11') and Formula (12).

$$VAC(RMS) = \frac{1}{\sqrt{2}} \cdot rR1 \cdot ID \quad \text{Formula (13)}$$

From this, it may be seen that, based on the resistance value of the resistor R1, the root mean square value VAC (RMS) of the single-phase AC input power VAC may be obtained.

In the embodiment, the voltage detection circuit 420 turns on the switch SW2 and the switch SW4 at the operation time point to1 between the time points tp3 and tp4 using the control signal SC1, and turns off the switch SW1, the switch SW3, the switch SW5, and the switch SW6 using the control signal SC2 and the control signal SC3. At the operation time point to1, the reference power IB1 sequentially provides the reference signal IV1 and the reference signal IV2 to the connection pin PC. Therefore, when the reference signal IV1 is provided, the voltage value VSO of the output signal SO is the over-voltage threshold value VTBNI used to detect of the "brown in" waveform of the single-phase AC input power VAC. When the reference signal IV2 is provided, the voltage value VSO of the output signal SO is the under-voltage threshold value VTBNO used to detect of the "brown out" waveform of the single-phase AC input power VAC. At the operation time point to1, the first comparator circuit 431 compares the voltage peak value VACP from the peak value information PKI with the over-voltage threshold value VTBNI and the under-voltage threshold value VTBNO to provide the waveform detection signal SDV1.

The voltage detection circuit 420 turns on the switch SW3 and the switch SW5 at an operation time point to2 between the time points tp3 and tp4 using the control signal SC2, and turns off the switch SW2 and the switches SW4 to SW6 using the control signal SC1 and the control signal SC3. At the operation time point to2, the reference power IB2 provides the reference signal IV3 to the connection pin PC. The voltage value VSO of the output signal SO is used as the over-voltage protection threshold value VTOVP. At the operation time point to2, the second comparator circuit 432 compares the voltage peak value VACP from the peak value information PKI with the over-voltage protection threshold value VTOVP to provide the over-voltage detection signal SDV2.

The voltage detection circuit 420 turns on the switch SW1 and the switch SW6 at an operation time point to3 between the time points tp3 and tp4 using the control signal SC3, and turns off the switches SW2 to SW5 using the control signal SC1 and the control signal SC2. At the operation time point to3, the reference power IB3 provides the temperature reference signal ITP to the connection pin PC. Therefore, at the operation time point to3, the voltage value VSO of the output signal SO may be derived from Formula (13').

$$VSO = \frac{iITP}{\frac{1}{rR1} + \frac{1}{rR2} + \frac{1}{rR3 + rRT}}$$ Formula (13')

At the operation time point to3, the third comparator circuit 433 compares the voltage value VSO of the output signal SO with the over-temperature voltage threshold value VTOT to provide the over-temperature detection signal SDT.

Further, based on Formula (13), the resistance value of the thermistor RT is as shown in Formula (14).

$$rRT = \frac{1}{\frac{iITP}{VSO} - \left(\frac{1}{rR1} + \frac{1}{rR2}\right)} - rR3$$ Formula (14)

When the resistance value of the resistor R1 is much greater than the resistance value of the resistor R2, Formula (14) is simplified to Formula (14').

$$rRT \cong \frac{rR2 \cdot \frac{VSO}{iITP}}{rR2 - \frac{VSO}{iITP}} - rR3$$ Formula (14')

Therefore, in design, the resistance value of the thermistor RT may be determined based on Formula (14').

At the reset time point tr between the time points tp3 and tp4, the voltage detection circuit 420 resets the peak value information PKI and turns off the switches SW1 to SW6.

At the time point tp4, when the voltage value of the voltage value of the single-phase AC input power VAC is higher than the voltage threshold value VT1, the voltage detection circuit 420 enters the sampling mode MD1.

In the embodiment, the voltage value VSO of the output signal SO located at the connection pin PC may be limited by boundary conditions. For example, the voltage value VSO of the output signal SO is designed to be less than a voltage value of the reference high voltage VDD used inside the detection circuit 400.

To sum up, the detection circuit of the disclosure samples the single-phase AC input power located at the input pin through the connection pin, and provides at least one of the waveform detection signal and the over-voltage detection signal in response to the peak value information. In addition, the detection circuit obtains the output signal of the thermal circuit through the connection pin to provide the over-temperature detection signal. The detection circuit of the disclosure may detect the state and the temperature of the AC input power only through the connection pin. Accordingly, the size of the detection circuit may be reduced.

Although the disclosure has been described with reference to the embodiments above, the embodiments are not intended to limit the disclosure. Any person skilled in the art may make some changes and modifications without departing from the spirit and scope of the disclosure. Therefore, the scope of the disclosure will be defined in the appended claims.

What is claimed is:

1. A detection circuit for a power supply circuit, wherein the power supply circuit comprises a thermal circuit, the thermal circuit is coupled to one of input pins of an AC power input terminal of the power supply circuit, and the detection circuit comprises:
a reference circuit, coupled to the thermal circuit through a connection pin, and configured to provide a temperature reference signal;
a voltage detection circuit, coupled to the connection pin and the reference circuit, and configured to:
enter a sampling mode to stop the reference circuit from providing the temperature reference signal, and sample a single-phase AC input power located at the input pin through the connection pin,
enter a hold mode to store a peak value information and enable the reference circuit to provide the temperature reference signal when the peak value information of the single-phase AC input power is sampled; and
a determination circuit, coupled to the connection pin, configured to provide at least one of a waveform detection signal and an over-voltage detection signal in response to the peak value information, and providing an over-temperature detection signal in the hold mode according to at least one of an output signal and the peak value information generated by the thermal circuit in response to the temperature reference signal.

2. The detection circuit according to claim 1, wherein the thermal circuit comprises:
a first resistor, coupled between the input pin and a voltage dividing node;
a second resistor, coupled between the voltage dividing node and a reference low voltage; and
a thermistor, wherein a first terminal of the thermistor is coupled to the voltage dividing node, and a second terminal of the thermistor is coupled to the connection pin.

3. The detection circuit according to claim 2, wherein the reference circuit comprises:
a reference power, configured to provide the temperature reference signal; and
a switch, wherein a first terminal of the switch is coupled to the reference power, a second terminal of the switch is coupled to the second terminal of the thermistor, and a control terminal of the switch is coupled to the voltage detection circuit.

4. The detection circuit according to claim 3, wherein the voltage detection circuit turns off the switch in the sampling mode, and turns on the switch in the hold mode.

5. The detection circuit according to claim 3, wherein the voltage detection circuit turns on the switch in the hold mode when a voltage value of the single-phase AC input power is lower than a voltage threshold value.

6. The detection circuit according to claim 2, wherein:
a resistance value of the first resistor is 100 times greater than a resistance value of the second resistor, and
a resistance value of the thermistor is determined by a voltage value of the output signal, a current value of the temperature reference signal, and the resistance value of the second resistor.

7. The detection circuit according to claim 2, wherein:
a resistance value of the first resistor is 100 times greater than a resistance value of the second resistor,
the over-temperature detection signal for triggering an over-temperature protection is provided when a voltage value of the output signal is greater than an over-temperature voltage threshold value, and
a resistance value of the thermistor is determined by the over-temperature voltage threshold value, a current value of the temperature reference signal, and the resistance value of the second resistor.

8. The detection circuit according to claim 2, wherein the determination circuit comprises:
a first comparator circuit, coupled to the connection pin, and configured to provide the waveform detection signal in the sampling mode according to an over-voltage threshold value, an under-voltage threshold value, and a voltage value at the connection pin;
a second comparator circuit, coupled to the connection pin, and configured to provide the over-voltage detection signal in the sampling mode according to an over-voltage protection threshold value and the voltage value at the connection pin; and
a third comparator circuit, coupled to the connection pin, and configured to provide the over-temperature detection signal in the hold mode according to an over-temperature voltage threshold value and the voltage value at the connection pin.

9. The detection circuit according to claim 8, wherein the third comparator circuit comprises:
a first transistor;
a second transistor, wherein a control terminal of the second transistor receives the over-temperature voltage threshold value;
a third resistor, coupled between the connection pin and a control terminal of the first transistor;
a fourth resistor, coupled between a reference high voltage and a first terminal of the first transistor;
a fifth resistor, coupled between the reference high voltage and a first terminal of the second transistor;
a comparator, wherein a non-inverting input terminal of the comparator is coupled to a second terminal of the second transistor, and an output terminal of the comparator is used for outputting the over-temperature detection signal;
a sixth resistor, coupled between a second terminal of the first transistor and an inverting input terminal of the comparator;
a first reference power, coupled between the inverting input terminal of the comparator and the reference low voltage; and
a second reference power, coupled between the non-inverting input terminal of the comparator and the reference low voltage.

10. The detection circuit according to claim 1, wherein the thermal circuit comprises:
a first resistor, coupled between the input pin and the connection pin;
a second resistor, coupled between the connection pin and a reference low voltage;
a third resistor, wherein a first terminal of the third resistor is coupled to the connection pin; and
a thermistor, coupled between a second terminal of the third resistor and the reference low voltage.

11. The detection circuit according to claim 10, wherein the reference circuit comprises:
a first reference power, configured to provide the temperature reference signal;
a first switch, wherein a first terminal of the first switch is coupled to the first reference power, a second terminal of the first switch is coupled to the connection pin, and a control terminal of the first switch is coupled to the voltage detection circuit;
a second reference power, configured to sequentially provide a first voltage reference signal and a second voltage reference signal;
a second switch, wherein a first terminal of the second switch is coupled to the second reference power, a second terminal of the second switch is coupled to the connection pin, and a control terminal of the second switch is coupled to the voltage detection circuit;
a third reference power, configured to provide a third voltage reference signal; and
a third switch, a first terminal of the third switch is coupled to the third reference power, a second terminal of the third switch is coupled to the connection pin, and a control terminal of the third switch is coupled to the voltage detection circuit.

12. The detection circuit according to claim 11, wherein the voltage detection circuit turns off the first switch, the second switch, and the third switch in the sampling mode, and sequentially turns on the first switch, the second switch, and the third switch in the hold mode.

13. The detection circuit according to claim 11, wherein the voltage detection circuit sequentially turns on the first switch, the second switch, and the third switch in the hold mode when a voltage value of the single-phase AC input power is lower than a voltage threshold value.

14. The detection circuit according to claim 11, wherein the determination circuit comprises:
a first comparator circuit, coupled to the connection pin, and configured to provide the waveform detection signal in the hold mode according to the peak value information and a voltage value located at the connection pin;
a second comparator circuit, coupled to the connection pin, and configured to provide the over-voltage detection signal in the hold mode according to the peak value information and the voltage value located at the connection pin; and
a third comparator circuit, coupled to the connection pin, and configured to provide the over-temperature detection signal in the hold mode according to an over-temperature voltage threshold value and the voltage value located at the connection pin.

* * * * *